United States Patent
Cooney, III et al.

(10) Patent No.: US 8,778,737 B2
(45) Date of Patent: Jul. 15, 2014

(54) FLATTENED SUBSTRATE SURFACE FOR SUBSTRATE BONDING

(75) Inventors: Edward C. Cooney, III, Jericho, VT (US); James S. Dunn, Jericho, VT (US); Dale W. Martin, Hyde Park, VT (US); Charles F. Musante, South Burlington, VT (US); BethAnn Rainey, Williston, VT (US); Leathen Shi, Yorktown Heights, NY (US); Edmund J. Sprogis, Underhill, VT (US); Cornelia K. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/285,443

(22) Filed: Oct. 31, 2011

(65) Prior Publication Data
US 2013/0105981 A1    May 2, 2013

(51) Int. Cl.
*H01L 21/00* (2006.01)
*H01L 29/10* (2006.01)

(52) U.S. Cl.
CPC ................ *H01L 29/1054* (2013.01)
USPC ........... 438/118; 257/E21.512; 257/E21.243; 438/631

(58) Field of Classification Search
CPC ....................................... H01L 24/02
USPC ........... 438/631, 118; 257/E21.512, E21.243
See application file for complete search history.

(56) References Cited

U.S. PATENT DOCUMENTS

| | | | |
|---|---|---|---|
| 5,820,770 A | 10/1998 | Cohen et al. | |
| 6,281,042 B1 | 8/2001 | Ahn et al. | |
| 6,406,636 B1 | 6/2002 | Vaganov | |
| 6,616,854 B2 | 9/2003 | Jones et al. | |
| 6,864,585 B2 * | 3/2005 | Enquist | 257/777 |
| 6,902,987 B1 | 6/2005 | Tong et al. | |
| 6,911,375 B2 | 6/2005 | Guarini et al. | |
| 7,371,661 B2 | 5/2008 | Chang et al. | |
| 7,470,142 B2 | 12/2008 | Lee | |
| 7,659,182 B2 | 2/2010 | Vaganov et al. | |

(Continued)

FOREIGN PATENT DOCUMENTS

| | | |
|---|---|---|
| WO | 2010057842 A1 | 5/2010 |
| WO | 2010057941 A1 | 5/2010 |

OTHER PUBLICATIONS

Singh, et al. "High-Quality Crystalline Layer Transfer from a Silicon-on-Insulator Substrate onto a Sapphire Substrate Using Wafer Bonding", Journal of Electronic Materials, Nov. 2003.

(Continued)

*Primary Examiner* — Amar Movva
(74) *Attorney, Agent, or Firm* — Wood, Herron & Evans LLP; Anthony J. Canale

(57) ABSTRACT

Methods for bonding substrate surfaces, bonded substrate assemblies, and design structures for a bonded substrate assembly. Device structures of a product chip are formed using a first surface of a device substrate. A wiring layer of an interconnect structure for the device structures is formed on the product chip. The wiring layer is planarized. A temporary handle wafer is removably bonded to the planarized wiring layer. In response to removably bonding the temporary handle wafer to the planarized first wiring layer, a second surface of the device substrate, which is opposite to the first surface, is bonded to a final handle substrate. The temporary handle wafer is then removed from the assembly.

22 Claims, 13 Drawing Sheets

(56) References Cited

U.S. PATENT DOCUMENTS

| | | |
|---|---|---|
| 7,713,837 B2 | 5/2010 | Chan et al. |
| 2003/0089950 A1 | 5/2003 | Kuech et al. |
| 2004/0152282 A1 | 8/2004 | Tong et al. |
| 2007/0148911 A1 | 6/2007 | Chang et al. |
| 2008/0124895 A1 | 5/2008 | Lo et al. |
| 2008/0268614 A1 | 10/2008 | Yang et al. |
| 2010/0261332 A1 | 10/2010 | Kim et al. |
| 2011/0012199 A1 | 1/2011 | Nygaard et al. |
| 2011/0014775 A1 | 1/2011 | Akiyama et al. |

OTHER PUBLICATIONS

International Searching Authority, International Search Report and Written Opinion issued in related International Application No. PCT/US12/49414 dated Oct. 9, 2012.

* cited by examiner

US 8,778,737 B2

FLATTENED SUBSTRATE SURFACE FOR SUBSTRATE BONDING

BACKGROUND

The present invention relates to semiconductor device fabrication and, more specifically, to methods for bonding substrate surfaces, bonded substrate assemblies, and design structures for a bonded substrate assembly.

Silicon-on-Sapphire (SOS) is one of the silicon-on-insulator (SOI) semiconductor manufacturing technologies generally suitable for demanding device applications. An SOS substrate includes an insulating bulk wafer of sapphire and a high-quality device layer of silicon on the insulating bulk substrate. The sapphire substrate virtually eliminates parasitic drain capacitance observed in bulk silicon technologies. A conventional method of forming a SOS substrate is to deposit a thin layer of silicon onto a bulk sapphire wafer at high temperature and may involve epitaxial re-growth of an amorphized surface layer. Silicon is usually deposited by the decomposition of silane gas ($SiH_4$) on a heated sapphire substrate. Device structures are fabricated using the device layer.

Improved methods for bonding substrate surfaces, bonded substrate assemblies, and design structures for a bonded substrate assembly are needed that extend the capabilities of bonded substrate manufacturing technology.

SUMMARY

According to one embodiment of the present invention, a method of substrate bonding is provided that involves a device substrate having a first surface and a second surface opposite to the first surface. The method includes forming device structures of at least one product chip using the first surface of the device substrate, forming a wiring layer of an interconnect structure for the device structures of the at least one product chip, and planarizing the wiring layer. In response to planarizing the wiring layer, a temporary handle wafer is removably bonded to the wiring layer. In response to removably bonding the temporary handle wafer to the wiring layer, the second surface of the device substrate is bonded to a final handle substrate.

According to another embodiment of the present invention, a bonded substrate assembly includes a device substrate with a first surface and a second a second surface opposite to the first surface. The design structure further includes a final handle substrate bonded to the second surface of the device substrate and at least one product chip with device structures on the first surface of the device structure. The design structure further includes an interconnect structure for the device structures. The interconnect structure has an interlayer dielectric layer with a top surface, a first conductive feature projecting above the top surface, and a second conductive feature projecting above the top surface. The second conductive feature is laterally separated by a gap from the first conductive feature. The first and second conductive features have a height measured relative to the top surface. At least one insulator layer fills the gap and has a thickness measured relative to the top surface that is greater than the height of the first and second conductive features.

According to another embodiment of the present invention, a design structure is provided that is readable by a machine used in design, manufacture, or simulation of an integrated circuit. The design structure includes a device substrate with a first surface and a second surface opposite to the first surface. The design structure further includes a final handle substrate bonded to the second surface of the device substrate and at least one product chip with device structures on the first surface of the device structure. The design structure further includes an interconnect structure for the device structures. The interconnect structure has an interlayer dielectric layer with a top surface, a first conductive feature projecting above the top surface, and a second conductive feature projecting above the top surface. The second conductive feature is laterally separated by a gap from the first conductive feature. The first and second conductive features have a height measured relative to the top surface. At least one insulator layer fills the gap and has a thickness measured relative to the top surface that is greater than the height of the first and second conductive features. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Generally, embodiments of the present invention relate to wafer or substrate bonding and, in particular, to improving the bonding integrity of substrates. One surface of the device substrate includes die with active device structures and a back-end-of-line (BEOL) structure that may incorporate passive device structures. The improved bonding integrity may be provided by planarizing a surface of the device substrate, which may be the exposed surface of a wiring layer of the BEOL interconnect structure, that is opposite to the surface of the device substrate implicated in the bonding process with the other substrate. In other words, the planarized surface is not the contacting surface involved in the bonding process, but is instead an opposite surface that is initially coupled in a removable manner with a temporary handle substrate, such as a glass substrate. The temporary handle substrate provides mechanical support during the bonding process joining the contacting surfaces of the device and final handle substrates and is removed following wafer bonding. The resulting bonded substrate assembly may find use in, for example, high-performance radio-frequency integrated circuits.

Figure 1:
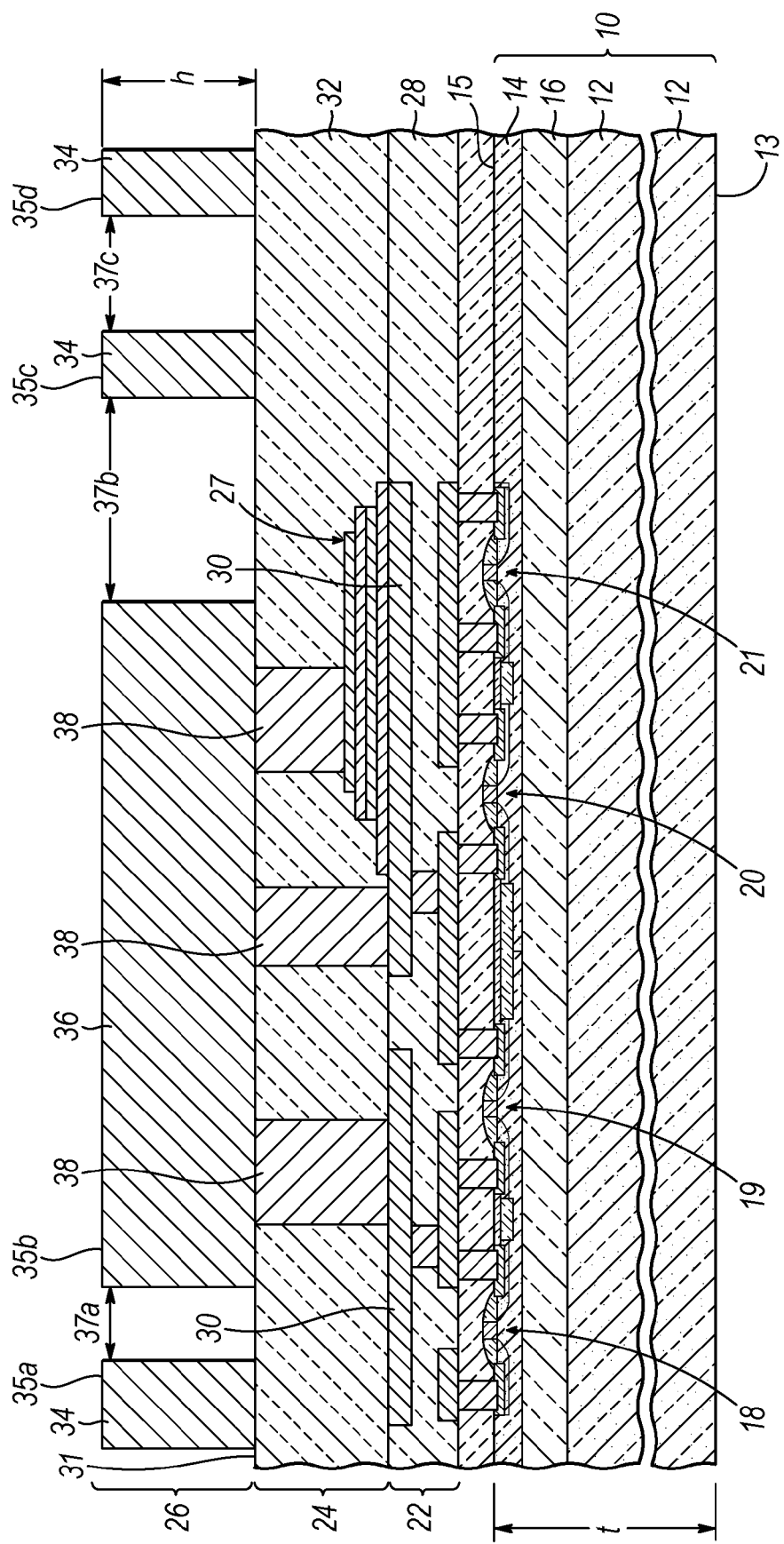
FIGS. 1-7 are cross-sectional views of successive stages of a substrate bonding process used to form a bonded substrate assembly in accordance with an embodiment of the invention.

With reference to FIG. 1 and in accordance with an embodiment of the invention, a device substrate 10 in the representative form of a semiconductor-on-insulator (SOI) substrate includes a bulk substrate 12, a device layer 14, and a buried insulator layer 16 that separates the device layer 14 from the bulk substrate 12. The device layer 14 is comprised of a semiconductor material, such as single crystal silicon or another monocrystalline material that contains primarily silicon. The bulk substrate 12 may also be constituted by a semiconductor material, such as single crystal silicon. The buried insulator layer 16 may be comprised of an electrical insulating material and, in particular, may be a buried oxide layer comprised of silicon dioxide (e.g., $SiO_2$). The buried insulator layer 16 electrically isolates the bulk substrate 12 from the device layer 14, which is considerably thinner than the bulk substrate 12. The device layer 14 is in direct contact along a continuous planar interface with a top surface of the buried insulator layer 16. The device substrate 10 may be fabricated by any suitable conventional technique, such as wafer bonding techniques or separation by implantation of oxygen (SIMOX) techniques, familiar to a person having ordinary skill in the art. The thicknesses of the device layer 14 and the buried insulator layer 16 may be chosen as design parameters of the fabrication process.

Figure 1A:
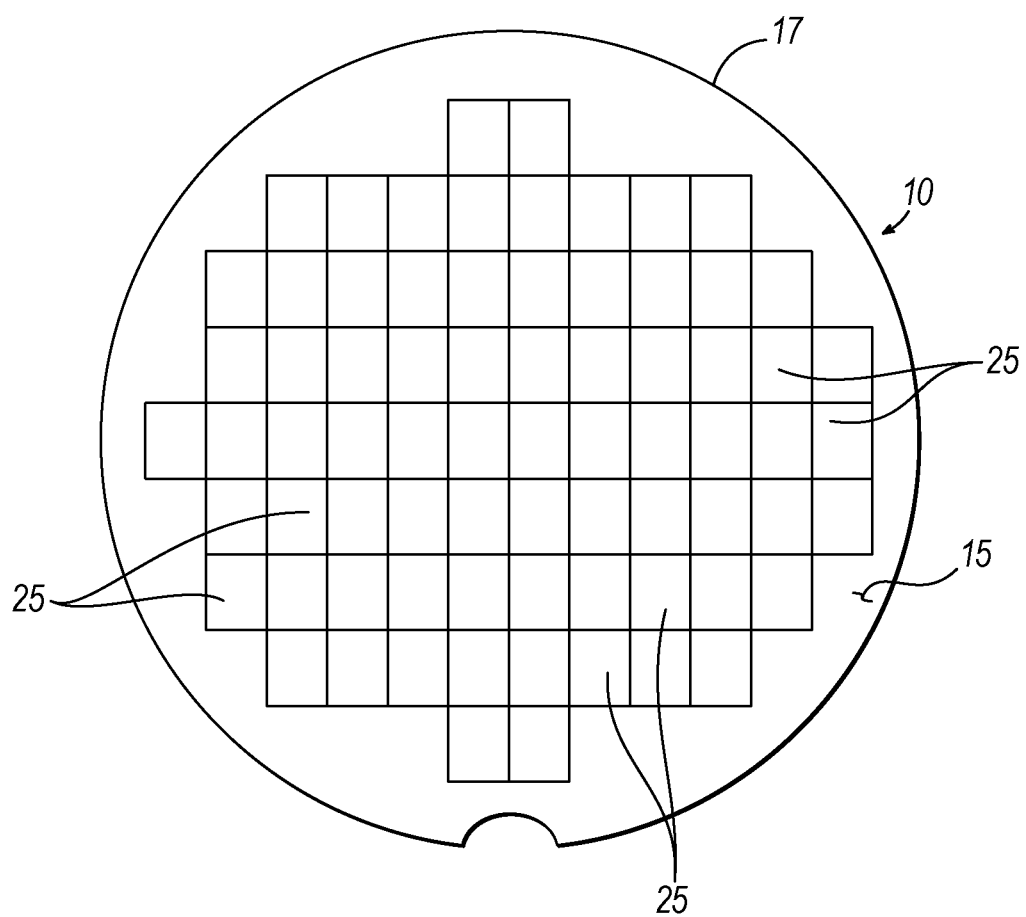
FIG. 1A is an enlarged view of the substrate of FIG. 1.

The bulk substrate 12, device layer 14, and buried insulator layer 16 each extend laterally to an outer peripheral edge 17 of the device substrate 10, as best shown in FIG. 1A. The device layer 14 has a surface 15 that is separated from the buried insulator layer 16 by the thickness of the device layer 14. The bulk substrate 12 has a surface 13 that is separated by the thickness of the bulk substrate 12 from the buried insulator layer 16. The surfaces 13, 15 of the device substrate 10, which are opposite to each other, extend laterally to the outer peripheral edge 17 of the device substrate 10 and respectively constitute the front and rear surfaces of the device substrate 10. The outer peripheral edge 17 extends from surface 13 to surface 15. Hence, the surfaces 13, 15 are separated from each other by the composite thickness, t, of the bulk substrate 12, device layer 14, and buried insulator layer 16. The device layer 14 and/or the buried insulator layer 16 may extend almost to the outer peripheral edge 17, but halt just short (e.g., 1 mm to 5 mm) of the outer peripheral edge 17.

During front-end-of-line (FEOL) processing, device structures 18, 19, 20, 21 are fabricated using various areas on the surface 15 of the device layer 14 as active circuitry of an integrated circuit of a product chip 25. Product chips 25 (FIG. 1A) are fabricated in parallel using the described process flow across the surface 15 of the device substrate 10. The device structures 18-21 on the product chips 25 are formed by FEOL techniques familiar to a person having ordinary skill in the art and each product chip 25 may include multiple device structure types distributed at different locations across the device layer 14. The active circuitry of the integrated circuit may comprise devices such as field-effect transistors bipolar junction transistors, junction field-effect transistors, etc.

In the representative embodiment, the device structures 18-21 are field-effect transistors fabricated by complementary metal-oxide-semiconductor (CMOS) processes familiar to a person having ordinary skill in the art. Each of the device structures 18-21 includes a gate electrode, a gate dielectric layer positioned between the gate electrode and the device layer 14, and source/drain regions in the semiconductor material of the device layer 14. The conductor constituting the gate electrode may comprise, for example, metal, silicide, polycrystalline silicon (polysilicon), or any other appropriate material(s) deposited by a CVD process, etc. The gate dielectric layer may be comprised of any suitable dielectric or insulating material including, but not limited to, silicon dioxide, silicon oxynitride, a high-k dielectric material such as hafnium oxide or hafnium oxynitride, or layered combinations of these dielectric materials. The device structures 18-21 may be formed using a gate first methodology or a gate last (replacement metal gate) methodology as being utilized in 45 nm, 32 nm, 22 nm and other advanced technology nodes. The source/drain regions may be formed by doping the semiconductor material of the device layer 14 with ion implantation, dopant diffusion, or a combination thereof. The device structures 18-21 may include other components such as halo regions, lightly doped drain (LDD) regions, etc. Shallow trench isolation regions, which supply electrical isolation for the device structures 18-21, are formed in the device layer 14 by, for example, a conventional patterning, etch, dielectric fill, and planarization process characteristic of standard bulk CMOS processing.

Standard back-end-of-line (BEOL) processing follows to fabricate an interconnect structure connecting the active device structures 18-21 to form the desired integrated circuits on each of the product chips 25. The interconnect structure may be comprised of wiring layers coupled with the device structures 18-21 and may include as many as eight or more wiring layers that supply conductive paths for signals, clock, power, etc. In the representative embodiment, the interconnect structure is a multi-level interconnect structure having wiring layers 22, 24, 26. Passive circuit elements, such as diodes, resistors, capacitors, varactors, and inductors, may be integrated into the interconnect structure.

Wiring layer 22 includes a plurality of conductive features 30 in the form of interconnect lines and conductor-filled vias that are arranged in an interlayer dielectric layer 28. The conductive features 30 are coupled with the device structures 18-21 and are electrically insulated by the interlayer dielectric layer 28. Wiring layer 24 includes conductor-filled vias 38 arranged as conductive features in an interlayer dielectric layer 32. The conductor-filled vias 38 are electrically insulated by the interlayer dielectric layer 32. Gaps between the conductive features 30 and between the conductor-filled vias 38 are respectively filled by the dielectric material of the interlayer dielectric layers 28, 32.

The wiring layers 22, 24 may be formed by deposition, polishing, lithography, and etching techniques characteristic of damascene processes as understood by a person having ordinary skill in the art. Specifically, interlayer dielectric layer 28 is deposited and pattern of via openings and/or trenches is defined therein using known lithography and etching techniques. The resulting via openings and/or trenches are lined with a liner (e.g., a bilayer of tantalum and tantalum nitride). A thick layer of a conductor (e.g., copper) is deposited on the interlayer dielectric layer 28 to overfill the vias and/or trenches. The conductor layer is planarized, such as with a chemical mechanical polishing (CMP) process, to remove the conductor to the level of the top surface of the interlayer dielectric layer 28 so that the conductive features 30 remain. The process is repeated using interlayer dielectric layer 28 to form the conductor-filled vias 38 of wiring layer 24. In particular, the top surface 31 of the interlayer dielectric layer 32 may be planarized during the damascene process when forming the conductor-filled vias 38 of wiring layer 24. Other metallization methods may also be employed to build one or more of the wiring layers 22, 24, such as subtractive aluminum patterning, may also be used with this invention.

Candidate conductive materials for the conductor of the wiring layers 22, 24 include, but are not limited to, copper (Cu), aluminum (Al), or an alloy of these metals. These types of metals may be deposited by chemical vapor deposition (CVD) or an electrochemical process like electroplating or electroless plating. The interlayer dielectric layers 28, 32 may be comprised of any suitable organic or inorganic dielectric material, such as $SiO_2$, hydrogen-enriched silicon oxycarbide (SiCOH), fluorosilicate glass (FSG), or another type of low-k dielectric material that may be deposited by CVD, such as low-pressure chemical vapor deposition (LPCVD) or plasma-enhanced chemical vapor deposition (PECVD).

A MIM capacitor 27 is present as a representative passive circuit element that is optionally present in wiring layer 24. The MIM capacitor 27 includes plate electrodes and an interplate dielectric layer disposed between each adjacent plate electrode pair as an electrical insulator. However, the MIM capacitor 27 may be omitted from the interconnect structure.

Wiring layer 26, which is a top wiring layer in the particular interconnect structure, includes wires 34 and a bond pad 36 each contacting a top surface 31 of the interlayer dielectric layer 32. The bond pad 36 is electrically and mechanically coupled by the conductor-filled vias 38 with the conductive features 30 in wiring layer 22 and with the MIM capacitor 27. The conductor filling the vias 38 may be comprised of one or more refractory metals, like tungsten (W), deposited by CVD.

The wires 34 and bond pad 36 may be conductive features fabricated with an aluminum metallurgy using a subtractive etching process. In the representative embodiment, the wires 34 and bond pad 36 directly contact the top surface 31 of interlayer dielectric layer 32. However, a liner layer, such as a bilayer of Ti/TiN, may be positioned as a diffusion barrier between the interlayer dielectric layer 32 and wires 34 and between the interlayer dielectric layer 32 and bond pad 36.

The wires 34 may be used as lines to transfer signals and power across each product chip 25. The bond pad 36 may be a power distribution pad coupled to either positive supply voltage ($V_{DD}$) or ground ($V_{SS}$), an I/O pad for communication signals to and from the active circuitry (e.g., device structures 18-21) on the product chip 25, or a dummy pad electrically isolated from the active circuitry of the product chip 25. Following singulation into die, the product chips 25 may be physically and electrically coupled to another structure, such as a circuit board, using the bond pad 36 and other similar bond pads by any of a number of different techniques, e.g., by compression soldering or C4 (Controlled Collapse Chip Connections).

The wires 34 and the bond pad 36 each project above the top surface 31 of the interlayer dielectric layer 32 and include respective top surfaces 35a-d that are spaced from the top surface 31 by a height, h. The height, h, of the wires 34 and the bond pad 36 may be on the order of 0.5 μm or taller, and may be as tall as 4 to 5 μm, and may be even taller. The surface area of the top surface 35b of the bond pad 36 may be larger than the surface area of the respective top surfaces 35a, 35c, 35d of some or all of the wires 34. Unfilled and open gaps 37a-c are present between the wires 34 and bond pad 36 and the top surface 31 of the interlayer dielectric layer 32. The gaps 37a-c have a height that is equal to the height, h, of the wires 34 and bond pad 36. Respective surface areas of the top surface 31 are exposed through the gaps 37a-c, which may have various widths and are not constrained to have the same width.

Figure 2:
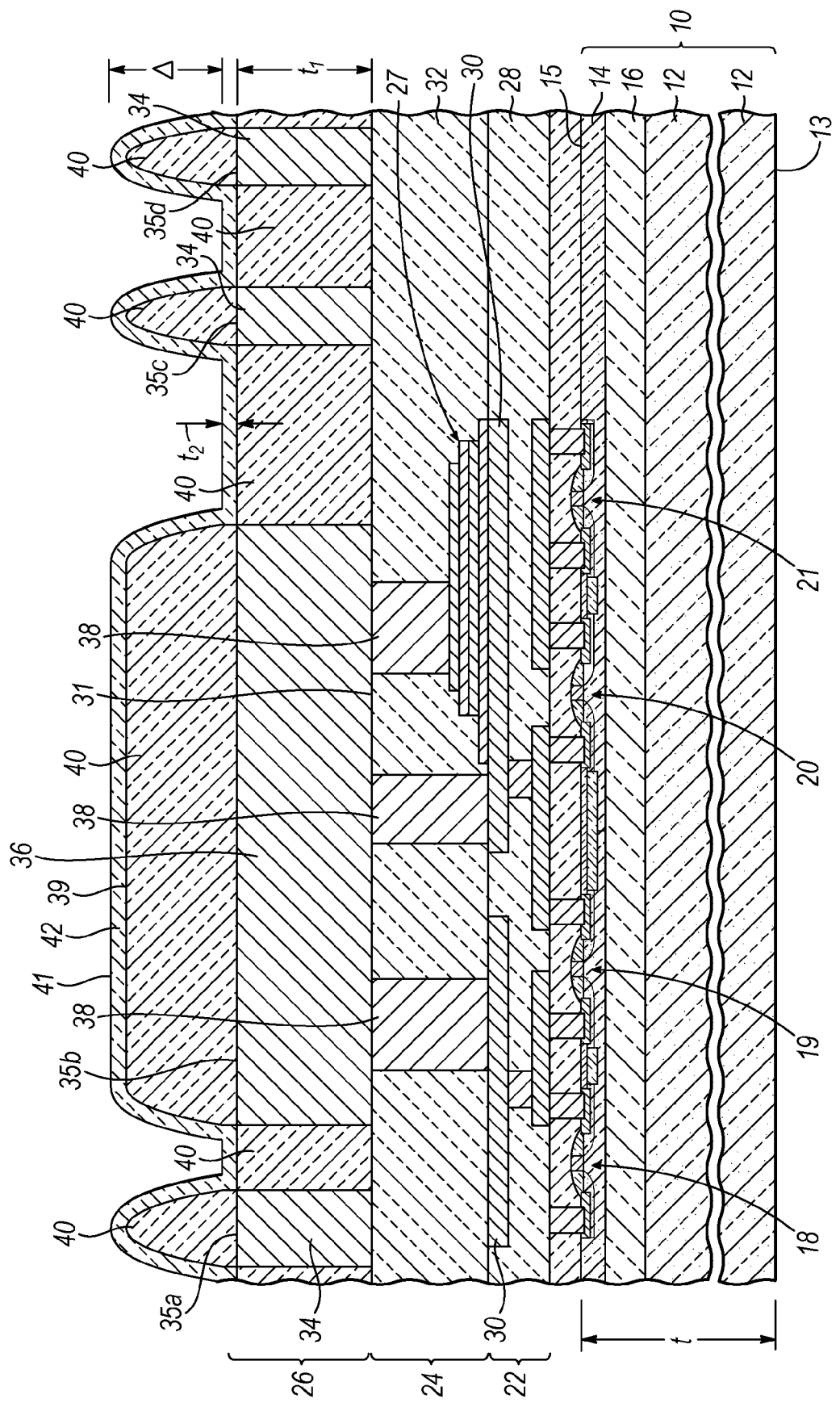

With reference to FIG. 2 in which like reference numerals refer to like features in FIG. 1 and at a subsequent fabrication stage, an insulator layer 40 is formed on the exposed surface areas of the top surface 31 of the interlayer dielectric layer 32 and on the top surfaces 35a-d of the wires 34 and the bond pad 36. Candidate dielectric materials for the insulator layer 40 may include, but are not limited to, an oxide of silicon (e.g., $SiO_2$), FSG, silicon nitride ($Si_3N_4$), or silicon oxynitride. In one embodiment, the insulator layer 40 is comprised of silicon dioxide deposited by a high density plasma chemical vapor deposition (HDPCVD) process using a mixture of process gases including silane ($SiH_4$), oxygen ($O_2$), and argon (Ar). Because a sputter component is added to the deposition process forming the insulator layer, the HDPCVD process can be controlled to efficiently promote gap-filling during deposition. In particular, the dielectric material of the insulator layer 40 may fill the gaps 37a-c between wires 34 and the bond pad 36 with minimal inclusion of seams or voids, and may be void free in one embodiment.

Insulator layer 40 has a layer thickness, $t_1$, that may be measured normal to the top surface 31 of the interlayer dielectric layer 32. In the representative embodiment, the layer thickness, $t_1$, is approximately equal to the height, h, of the wires 34 and bond pad 36. However, the layer thickness, $t_1$, of insulator layer 40 may less than less than the height, h, or greater than the height, h. The portions of insulator layer 40 filling the gaps 37a-c operates to reduce the gap depth. The topography of the wires 34 and bond pad 36 is reproduced in the insulator layer 40 so that a top surface 39 of the insulator layer 40 is non-planar with peaks overlying the wires 34 and bond pad 36 and valleys overlying the gaps 37a-c. The height difference between the peaks and valleys is approximately equal to the height, h, of the wires 34 and bond pad 36. A step in elevation occurs at each transition from peak to valley.

An insulator layer 42 is conformally deposited on the top surface 39 of insulator layer 40. Candidate dielectric materials for the insulator layer 42 may include, but are not limited to, an oxide of silicon, such as $SiO_2$, or FSG deposited conformally by, for example, a PECVD process. The insulator layer 42 may be highly conformal (i.e., of approximately the same thickness, for example, within ±2% to ±5% of the average thickness) on vertical and horizontal surfaces. In one embodiment, the insulator layers 40 and 42 may be comprised of the same dielectric material.

Insulator layer 42 has a layer thickness, $t_2$, that may be measured normal to the top surface 31 of the interlayer dielectric layer 32. Insulator layer 42 may be thinner than the insulator layer 40 and, in the representative embodiment, the layer thickness, $t_2$, of the insulator layer 42 may be less than 50% of the layer thickness, $t_1$, of the insulator layer 40. The addition of insulator layer 42 adds an additional thickness of dielectric material and, in particular, adds an additional overburden of dielectric material over the portions of the insulator layer 40 occupying the gaps 37a-c.

The topography in insulator layer 40 from the wires 34 and bond pad 36 is reproduced in the insulator layer 42. As a result, a top surface 41 of the insulator layer 42 is non-planar with peaks overlying the wires 34 and bond pad 36 and valleys overlying the gaps 37a-c. The peak-to-valley distance is approximately equal to the height, h, of the wires 34 and bond pad 36. Specifically, a step height in the form of a height difference, A, in elevation exists between elevated portions of the insulator layers 40, 42 over the wires 34 and bond pad 36 and lowered portions of the insulator layers 40, 42 over the gaps 37a-c.

In an alternative embodiment, the deposition of insulator layer 42 may be omitted from the process flow. The omission of insulator layer 42 and the presence of only insulator layer 40 maybe appropriate in instances in which the spacing between the wires 34 and bond pad 36 is sufficiently large. The insulator layers 40, 42 may also cover all of the device substrate 10 disposed inside the outer peripheral edge 17 and, in particular, may cover all of the product chips 25. The dielectric materials comprising the insulator layers 40, 42 may have a hardness and/or stiffness greater than a polymer material, such as polyimide. Additional layers may be applied in conjunction with insulator layers 40, 42 and may have a similar or different composition in comparison with one or both the insulator layers 40, 42. One or both of the insulator layers 40, 42 may be divided into sub-layers that are deposited separately but that cumulatively provide the total targeted layer thicknesses.

Figure 3:
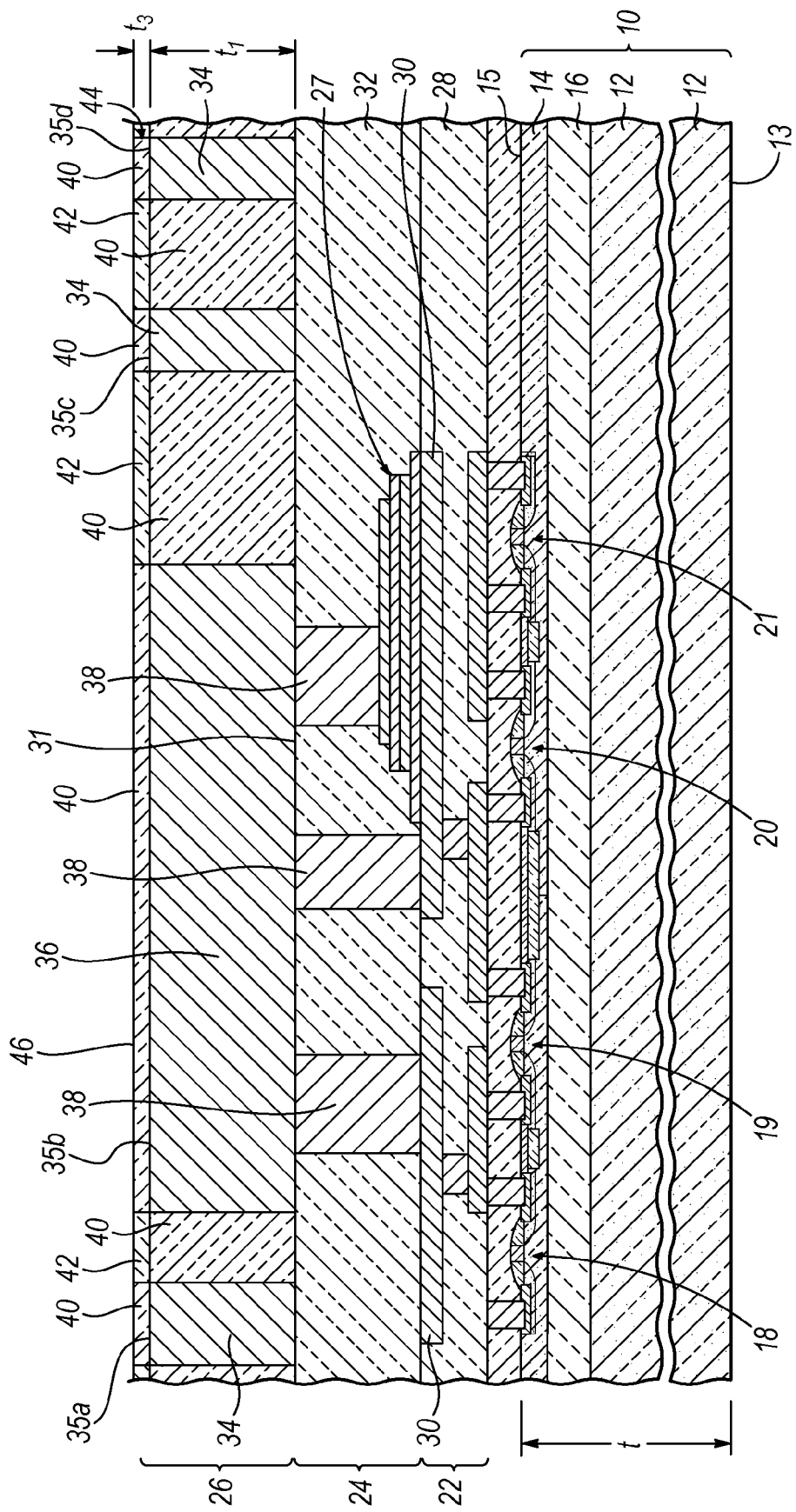

With reference to FIG. 3 in which like reference numerals refer to like features in FIG. 2 and at a subsequent fabrication stage, a polishing process such as chemical mechanical polishing (CMP) is applied to planarize the insulator layers 40, 42 to provide a composite insulator layer 44 with a flattened top surface 46 that is free of or otherwise lacks significant topography originating from the wires 34 and bond pad 36. Residual portions of insulator layer 40 contact the top surface areas of the wires 34 and the bond pad 36. Residual portions of insulator layer 40 contact the surface area of the top surface 31 of the interlayer dielectric layer 32 in the gaps 37a-c, and residual portions of insulator layer 42 contact these residual portions of insulator layer 40.

As a result of the polishing, the insulator layer 44 is comprised of a composite of insulator layers 40, 42 having a lateral and/or stacked arrangement and may have a thickness, $t_3$, that is less than the thickness, $t_2$, of the insulator layer 42. While the sections of insulator layers 40, 42 are depicted as segmented sections of insulator layer 44, a person having ordinary skill in the art will appreciate that the sections of insulator layers 40, 42 may lack well-defined boundaries and may comprise continuous adjoining sections of dielectric material. Insulator layer 42 provides an additional overburden of dielectric material for purposes of improving the planarity of the top surface 46 at the conclusion of the CMP process.

The surface topography of the insulator layers 40, 42 is flattened and smoothed by the CMP process to form the planarized top surface 46 of insulator layer 44. To perform the CMP process, the device substrate 10 is loaded into a CMP system with the tallest points projecting above the top surface 41 of the insulator layer 42 in direct contact with a polishing pad. The device substrate 10 is pressed against the polishing pad and a slurry is dispensed onto the polishing pad. The slurry may be comprised of a carrier fluid with an alkaline pH and an abrasive material (e.g., finely divided silica) that is suspended in the carrier fluid. The device substrate 10 and the polishing pad are spun and/or oscillated relative to each other to generate mechanical forces in conjunction with the applied pressure. Slurry trapped between the insulator layers 40, 42 initially removes the high points of the insulator layer 42 and, in locations where insulator layer 42 is completely removed, removes insulator layer 40. Material removal during the CMP process combines an etching effect that polishes the substrate surface at the submicron level and abrasion. The CMP process is sustained for a given polish time or until the occurrence of a detected end point. Preferably, the polishing process partially removes insulator layer 42 but does not remove the entire thickness of insulator layer 42 so that the wires 34 and bond pad 36 are covered by the thickness, $t_3$, of the composite insulator layer 44. Following the CMP process, residual slurry may be cleaned from the top surface 46. The CMP process may be conducted with a commercial CMP tool using standard polishing pads and slurries for polishing the dielectric material of insulator layers 40, 42 (e.g., silicon dioxide) known to a person having ordinary skill in the art.

Planarization, as used herein, is a process (e.g., the CMP process) of flatting and smoothing the insulator layers 40, 42 provide the smooth and flat top surface 46 of insulator layer 44 that lacks most, if not all, of the topography of the underlying device structures 18-21. The planarization is accomplished by deposition of additional dielectric material in the insulator layers 40, 42 and then back polishing the dielectric material to remove the topography from the wires 34 and bond pad 36.

The height difference, Δ, (FIG. 2) is significantly reduced by the planarization and may be reduced to provide planarity for all regions of the insulator layer 44. However, a step height difference may remain for regions of the insulator layer 44 overlying the device structures 18-21 and regions of the insulator layer 44 overlying the gaps 37a-c while still considering the top surface 46 to be planarized. The step height difference arises from differences in polishing rate for patterned regions in which the insulator layer 44 overlies the device structures 18-21 and non-patterned regions in which the insulator layer 44 overlies the gaps 37a-c. In one embodiment, the step height difference may be on the order of 10 percent or less of the original height of the wires 34 and bond pad 36. For example, if the height of the wires 34 and bond pad 36 is 4 μm, the step height difference may be 0.4 μm or less.

The topography may be reduced across the entire device substrate 10 so that the flattened and smoothed insulator layer 44 covers the entire surface area peripherally inside the outer peripheral edge 17 and, in particular, the surface areas coinciding with all of the product chips 25.

Figure 4:
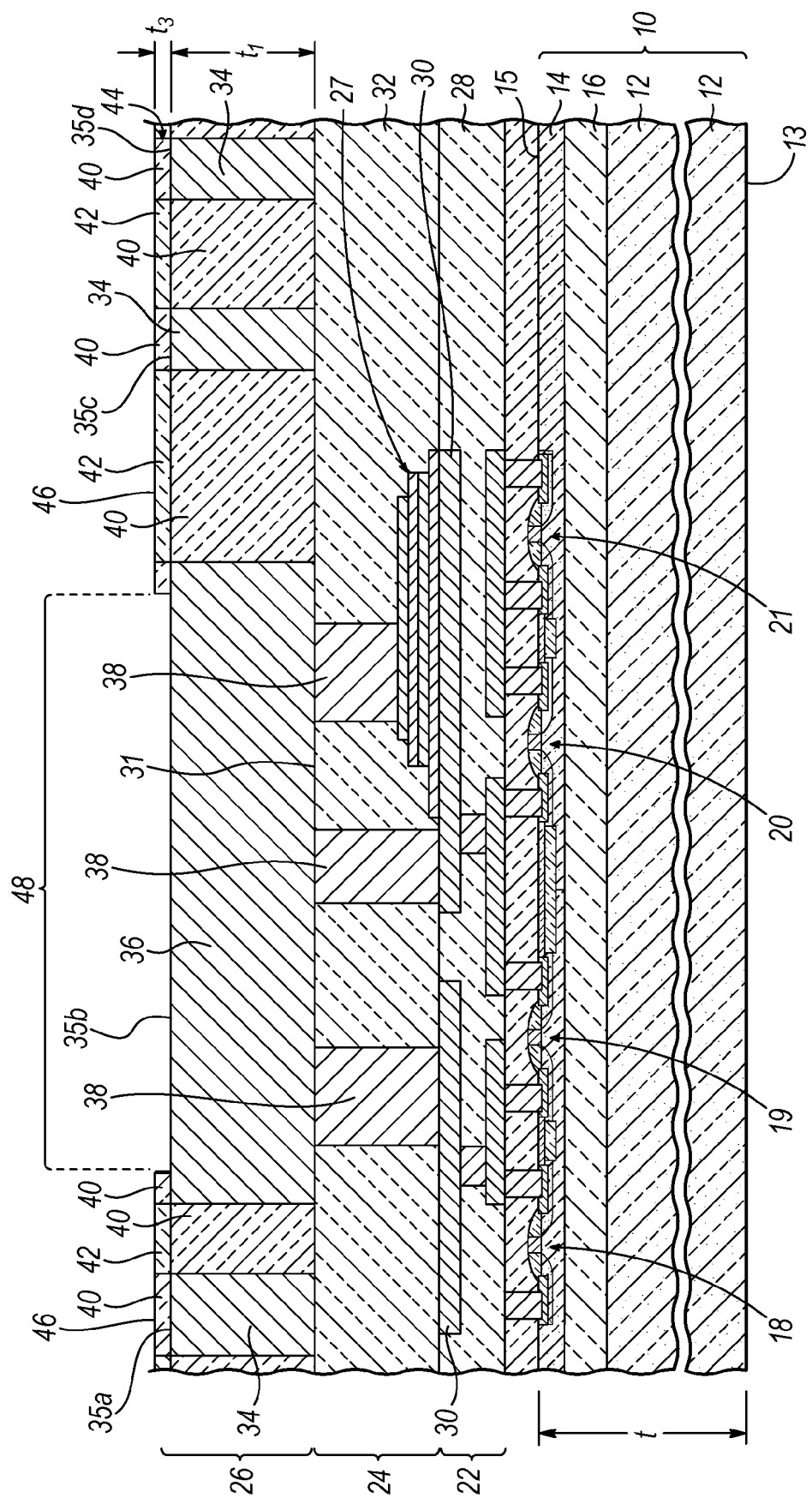

With reference to FIG. 4 in which like reference numerals refer to like features in FIG. 3 and at a subsequent fabrication stage, an opening 48 is defined in the insulator layer 44 that coincides with a portion of the surface area of the bond pad 36. The opening 48 may be defined in the insulator layer 44 by a lithography and etching process. The lithography process may entail applying a photosensitive polymer, such as photosensitive polyimide (PSPI), on the top surface 46 of insulator layer 44, soft curing, exposing the resist through a photomask to a pattern of radiation effective to define a latent window in the resist at the intended location of the opening 48, developing to form the window, and hard curing. The photosensitive polymer may be prepared by dissolving the polymer in a solvent to form a precursor, spreading the precursor with a spin coating process as a coating across the top surface 46, and then drying the coating to remove solvents and partially imidize and crosslink the polymer.

The etching process forming the opening 48 inside the window in the photosensitive polymer by an anisotropic dry etch, such as reactive-ion etching (RIE), that relies on the patterned resist as an etch mask. The etching process may be conducted in a single etching step or multiple etching steps with different etch chemistries, including a standard oxide RIE process for the insulator layer 44 if comprised of oxide. The photosensitive polymer may be removed from the top surface 46 after the opening 48 is formed. The insulator layer 44 may be preserved over the wires 34 so that the wires 34 remain covered by dielectric material. The photosensitive polyimide can be stripped by ashing, such as exposure to an oxygen plasma, or a chemical solution, such as an HF solution.

In an alternative embodiment, the opening of the bond pad 36 may be postponed in the process flow until after the transfer operation involving the final handle substrate.

Figure 5:
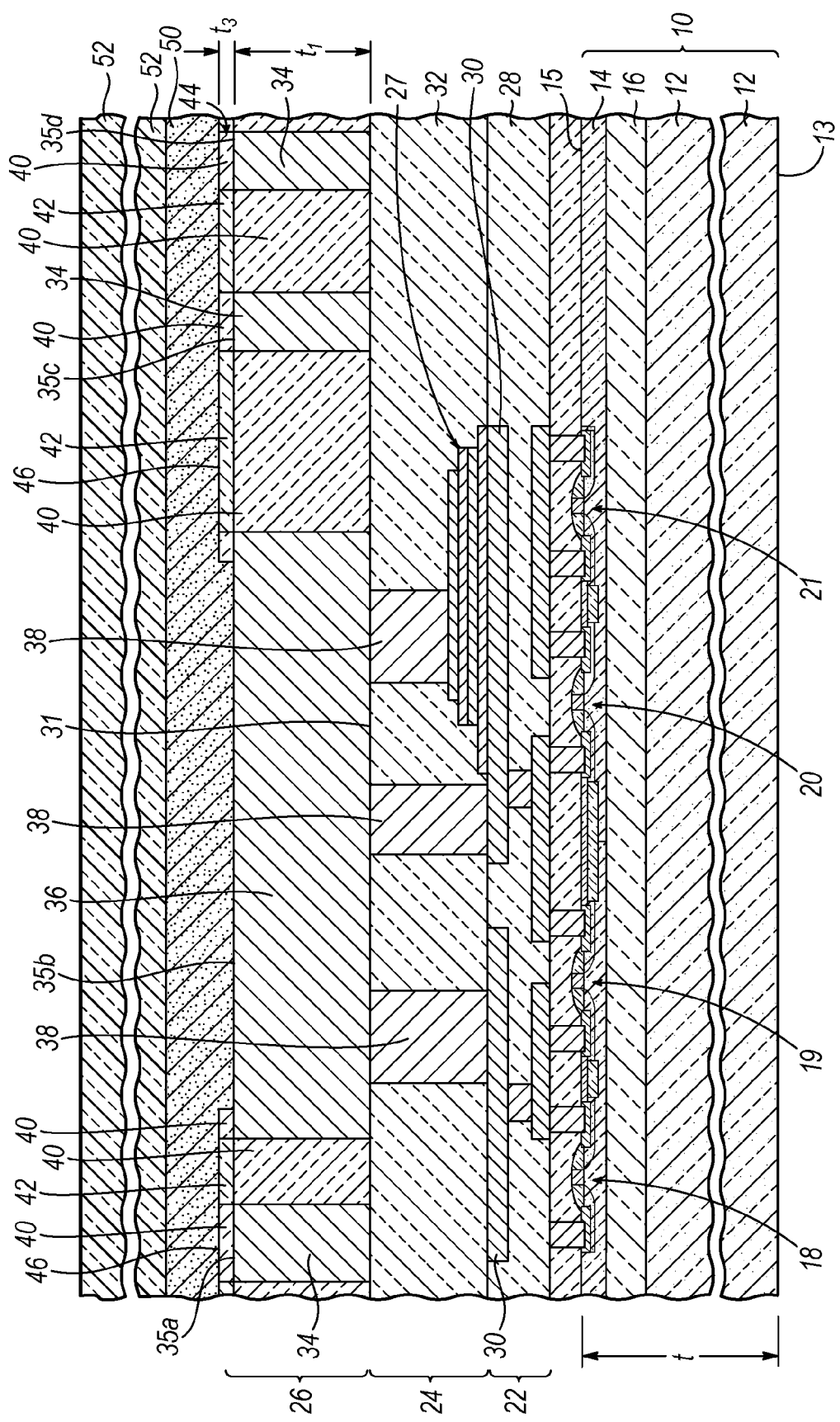

With reference to FIG. 5 in which like reference numerals refer to like features in FIG. 4 and at a subsequent fabrication stage, a layer 50 of an adhesive is applied to the top surface 46 of the insulator layer 44 and a temporary handle substrate 52 is adhesively bonded by the adhesive layer 50 to the insulator layer 44. The temporary handle substrate 52 is sufficiently thick for mechanical handling after the bulk substrate 12 is thinned in a subsequent processing step. The temporary handle substrate 52 may be comprised of glass and the adhesive layer may be comprised of a polymer adhesive. The adhesive strength of the adhesive layer 50 is selected such that the temporary handle substrate 52 is removable from the top surface 46. Other techniques may be used to temporarily attach the temporary handle substrate 52 instead of adhesive bonding.

Figure 6:
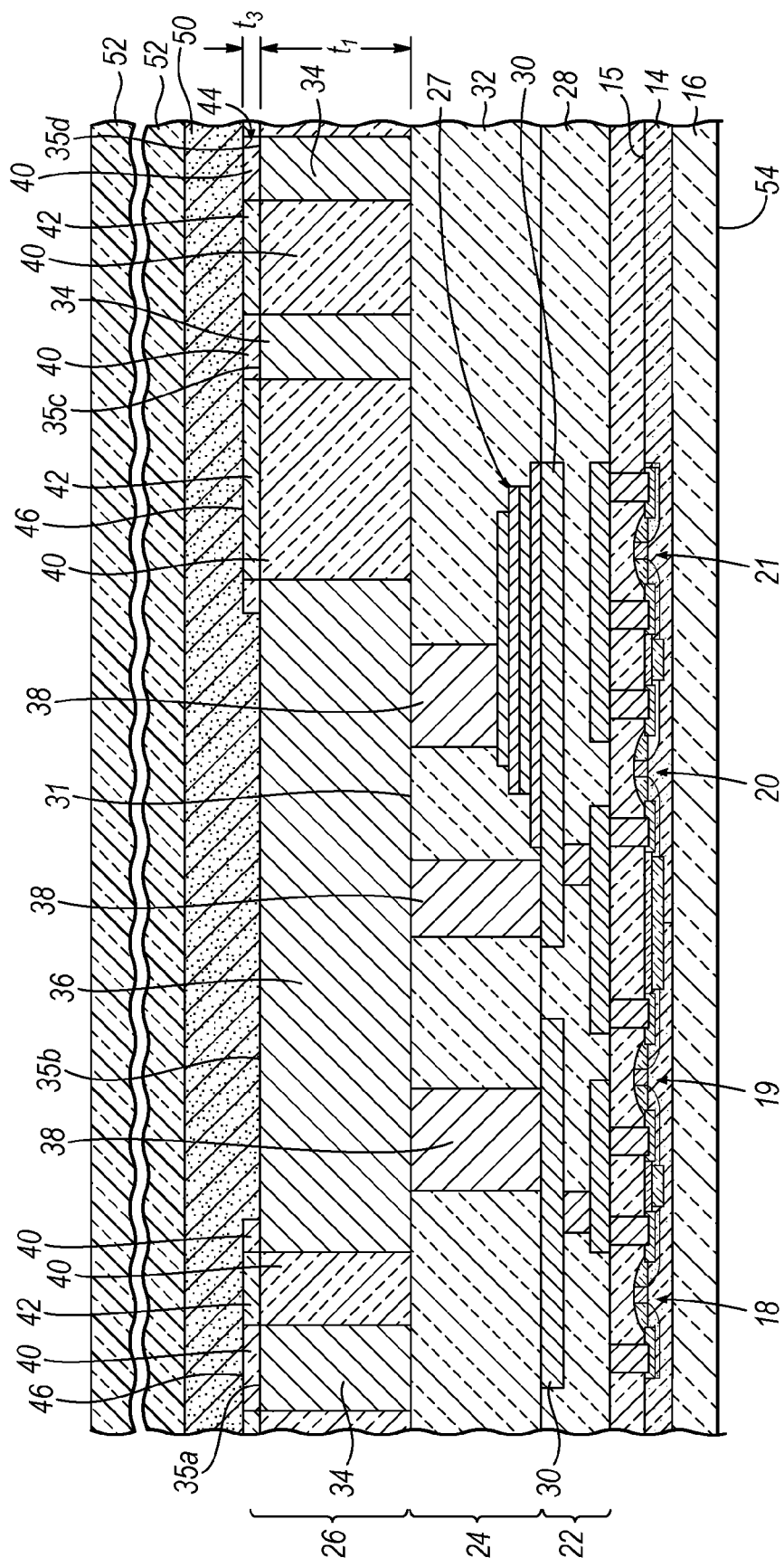

With reference to FIG. 6 in which like reference numerals refer to like features in FIG. 5 and at a subsequent fabrication stage, the bulk substrate 12 is removed in its entirety by grinding, etching, and/or CMP to expose a surface 54 of the buried insulator layer 16. The buried insulator layer 16 may be partially removed by CMP, or another polishing process or etching process, so that the buried insulator layer 16 is thinned before proceeding to the next fabrication stage. However, the buried insulator layer 16 is not removed in its entirety at the conclusion of this fabrication stage so that the surface 54 lies at an intermediate position relative to the initial thickness of the buried insulator layer 16.

Figure 7:
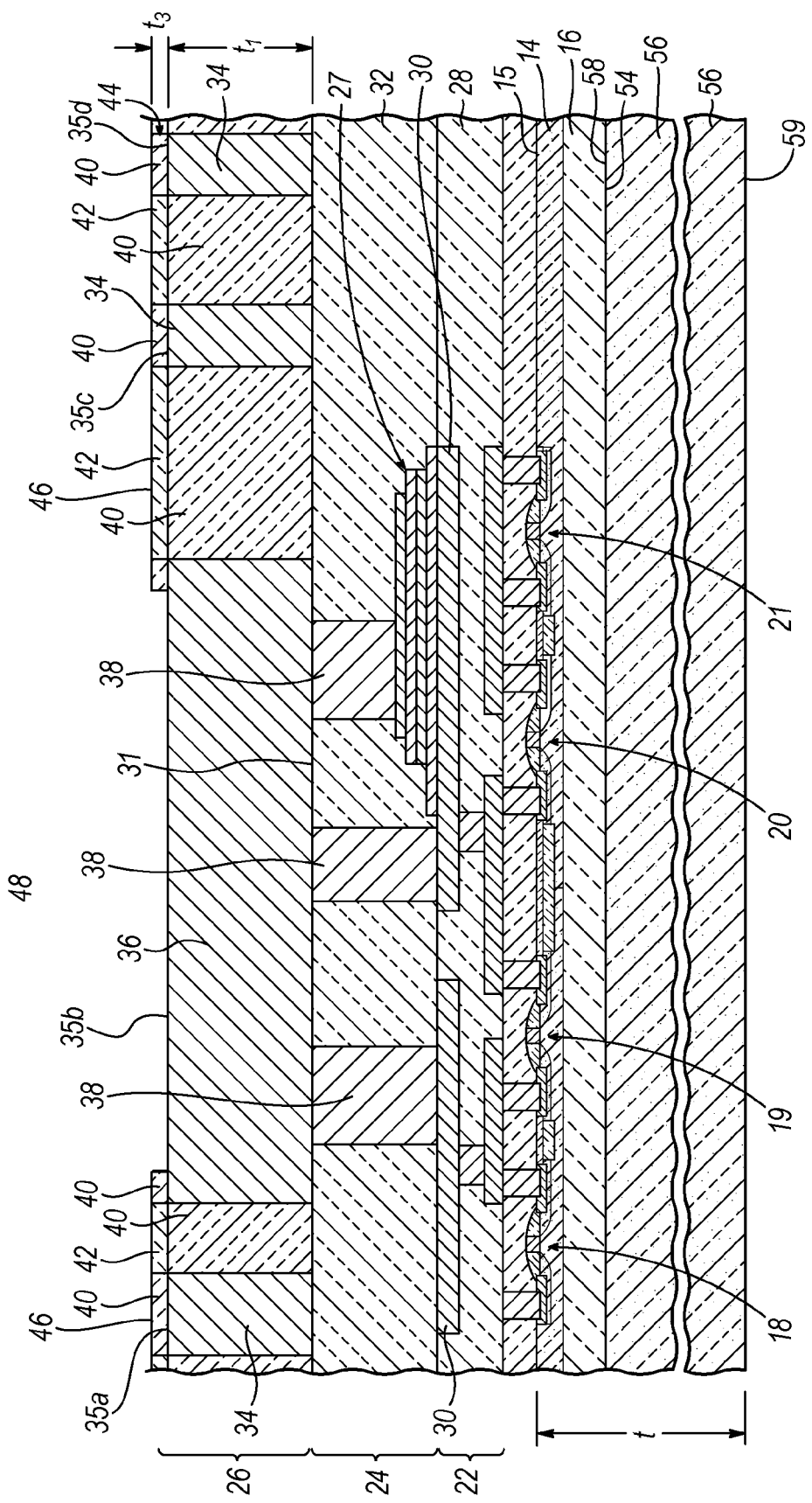

With reference to FIG. 7 in which like reference numerals refer to like features in FIG. 6 and at a subsequent fabrication stage, the device layer 14 of the device substrate 10, the device structures 18-21, the wiring layers 22, 24 of the BEOL interconnect structure, and the wires 34 and bond pad 36 are transferred intact as a transfer layer from the temporary handle substrate 52 to a final handle substrate 56 to form an assembly. In particular, the surface 54 of the buried insulator layer 16 exposed by the removal of the bulk substrate 12 is contacted with a surface 58 of the final handle substrate 56 and these surfaces 54, 58 are bonded together. In various embodiments, the final handle substrate 56 may be comprised of sapphire, a III-V semiconductor material such as gallium arsenide (GaAs), a glass, oxidized silicon wafer, an oxide layer on sapphire, etc. If the final handle substrate 56 is comprised of a sapphire substrate and the device layer 14 is comprised of silicon, the bonding between contacting surfaces 54, 58 may form a silicon-on-sapphire (SOS) substrate. The final handle substrate 56 has another surface 59 that is separated from surface 58 by the thickness of the final handle substrate 56.

The contacting surfaces 54, 58 may be bonded together by a bonding process that exposes the contacting surfaces 54, 58 to conditions that are capable of increasing their mutual bonding energy. The surfaces 54, 58, which are flat, smooth and clean, may be joined by direct bonding without the presence of an intermediate layer or external force. When the surfaces 54, 58 are brought into the contacting relationship, weak bonding occurs based on physical forces, such as van der Waals forces. The wafer pair is then subjected to a low temperature thermal treatment or anneal at a sufficient temperature and for a sufficient duration to convert physical forces to chemical bonds. For example, a representative bonding process may include a thermal anneal conducted at a temperature of less than or equal to 400° C. and for a duration sufficient to promote surface-to-surface bonding between the contacting surfaces. The temperature of the thermal anneal is sufficiently low so that the temperature-sensitive device structures 18-21 and potentially other structures are not adversely impacted to a significant extent. The temperature of the thermal anneal may be reduced by a pretreatment, such as plasma activation or chemical activation. Optionally, the device substrate 10 and final handle substrate 56 may be clamped together during the thermal anneal to provide compression. The thermal anneal, which may be performed in the presence or absence of an external force, is also typically performed in a controlled atmosphere comprised of a non-oxidizing gas, such as $N_2$.

The bond strength of the device substrate 10 to the temporary handle substrate 52 mediated by the adhesive layer 50 is weaker than the bond strength of the device substrate 10 to the final handle substrate 56. As a result, the temporary handle substrate 52 can be released and removed by preferential delamination along the relatively weak interface between the adhesive layer 50 and the top surface 46 of the insulator layer 44. The end result is that the final handle substrate 56 is joined to the dielectric material of the buried insulator layer 16. Residual adhesive from the adhesive layer 50 may be removed by, for example, an ashing process.

The bonding of the final handle substrate 56 to the device substrate 10 occurs after the product chips 25 (FIG. 1A) are fabricated using the device layer 14 and, in the illustrated embodiment, after the wiring layers 22, 24 of the interconnect structure are fabricated. Hence, in the representative embodiment, the layer transfer occurs after FEOL processing and BEOL processing are completed.

The planarization of the wires 34 and bond pad 36 provides a flattened, smooth top surface 46 on the insulator layer 44 that is bonded to the temporary handle substrate 52 and that is opposite to the surface 13 of the bulk substrate 12 and surface 54 of the buried insulator layer 16. The filling of the gaps 37a-c with dielectric material and the reduction in the surface topography created by the wires 34 and bond pad 36 improves the integrity and quality of the wafer bonding that occurs between the contacting surfaces 54, 58. The improvement in wafer bonding integrity is independent of the presence or absence of passive elements, such as MIM capacitor 27. The improvement in bonding integrity is obtained by planarizing the top surface 46 that is opposite to the surface 54 of the buried insulator layer 16 of device substrate 10 implicated in the bonding process with the surface 58 of the final handle substrate 56. The planarized top surface 46 is physically distinguishable from the surface 54 of the buried insulator layer 16 of device substrate 10 involved in the bonding process with surface 58 of the final handle substrate 56, but is an opposite surface to surface 54. The planarized top surface 46 is coupled in a removable manner with the temporary handle substrate 52 in advance of the transfer of the transfer layer to the final handle substrate 56.

The top surface 46 of the insulator layer 44 is separated from the surface 13 of the bulk substrate 12 by the thicknesses of the bulk substrate 12, the buried insulator layer 16, the device layer 14, and the wiring layers 22, 24 of the interconnect structure. After the bulk substrate 12 is removed in advance of wafer bonding, the top surface 46 of the insulator layer 44 is opposite to the surface 13 of the bulk substrate 12 and separated from the surface 54 of the buried insulator layer 16 by the thicknesses of the buried insulator layer 16, the device layer 14, and the wiring layers 22, 24 of the interconnect structure.

Figure 8:
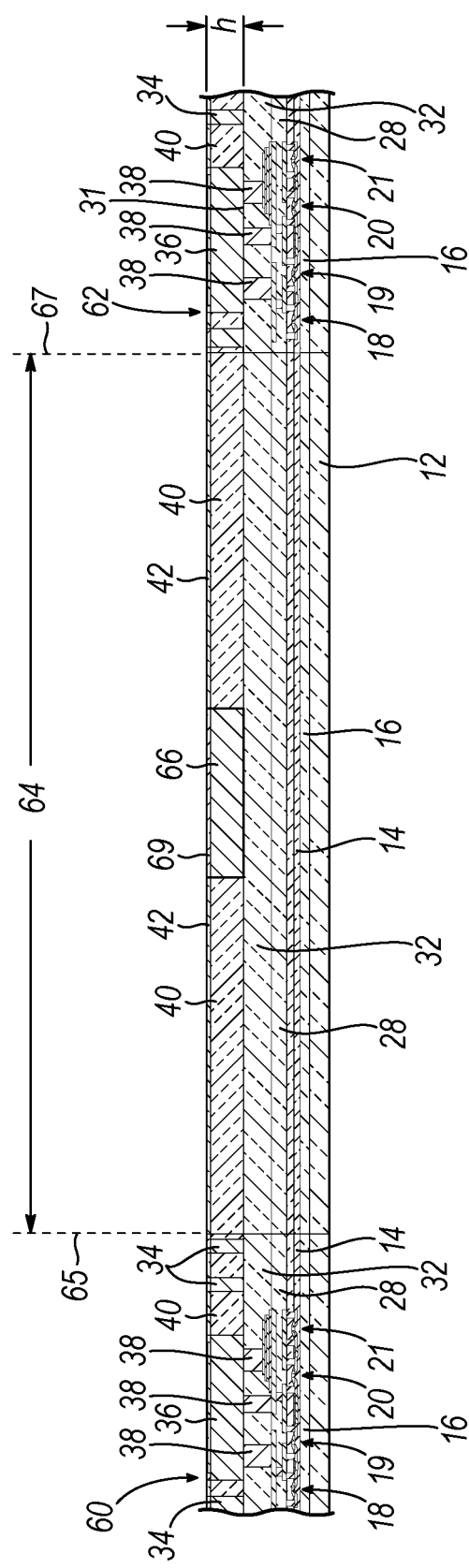
FIG. 8 is a cross-sectional view showing adjacent die on a device substrate at the stage of the wafer bonding process shown in FIG. 4.

With reference to FIG. 8 in which like reference numerals refer to like features in FIG. 4, product chips 60, 62 are representative of the product chips 25 (FIG. 1A) and each of the product chips 60, 62 includes a replicated version of the planarized construction shown in FIG. 4. A kerf street 64 is disposed between each adjacent pair of product chips 60, 62. Kerf street 64 has a boundary 65 with product chip 60 and a boundary 67 with product chip 62. Other kerf streets each similar to kerf street 64 are disposed between adjacent pair of product chips 25. The kerf streets are used as cutting lanes during the singulation of the individual product chips 25 into a corresponding plurality of die.

In particular and with continued reference to FIG. 8, the kerf street 64 is reserved as dead space between the product chips 60, 62 so that the product chips 60, 62 can be singulated without damaging the product chips 60, 62. A dicing saw or a laser apparatus may be used to cut or scribe the device substrate 10 and final handle substrate 56 along each kerf street 64 and thereby physically separate the product chips 60, 62 into discrete die.

A test pad 66 may be formed in the kerf street 64 by the same process steps forming the wires 34 and the bond pad 36. The test pad 66 may be coupled with a testing integrated circuit structure built in the kerf street 64. Similar to bond pad 36 and prior to planarization, test pad 66 that projects above the top surface 31 of the interlayer dielectric layer 32. A top surface 69 of the test pad 66 may project above the top surface 31 of the interlayer dielectric layer 32 by the same height, h, as the bond pad 36 above the top surface 31 of the interlayer dielectric layer 32.

The insulator layers 40, 42 are also deposited in the kerf street 64 and fill open space adjacent to the test pad 66 and cover the test pad 66. When the insulator layers 40, 42 are flattened and smoothed by the CMP process to form the composite insulator layer 44, the top surface 46 of insulator layer 44 (FIG. 7) also extends laterally across the kerf street 64. Scribe channels may be formed in the insulator layer 44 at locations adjacent to the boundaries 65, 67. Hence, the deposition of the insulator layers 40, 42 and the subsequent CMP process may provide a global planarization across the diameter of the device substrate 10 including kerf streets between the product die.

Figure 9:
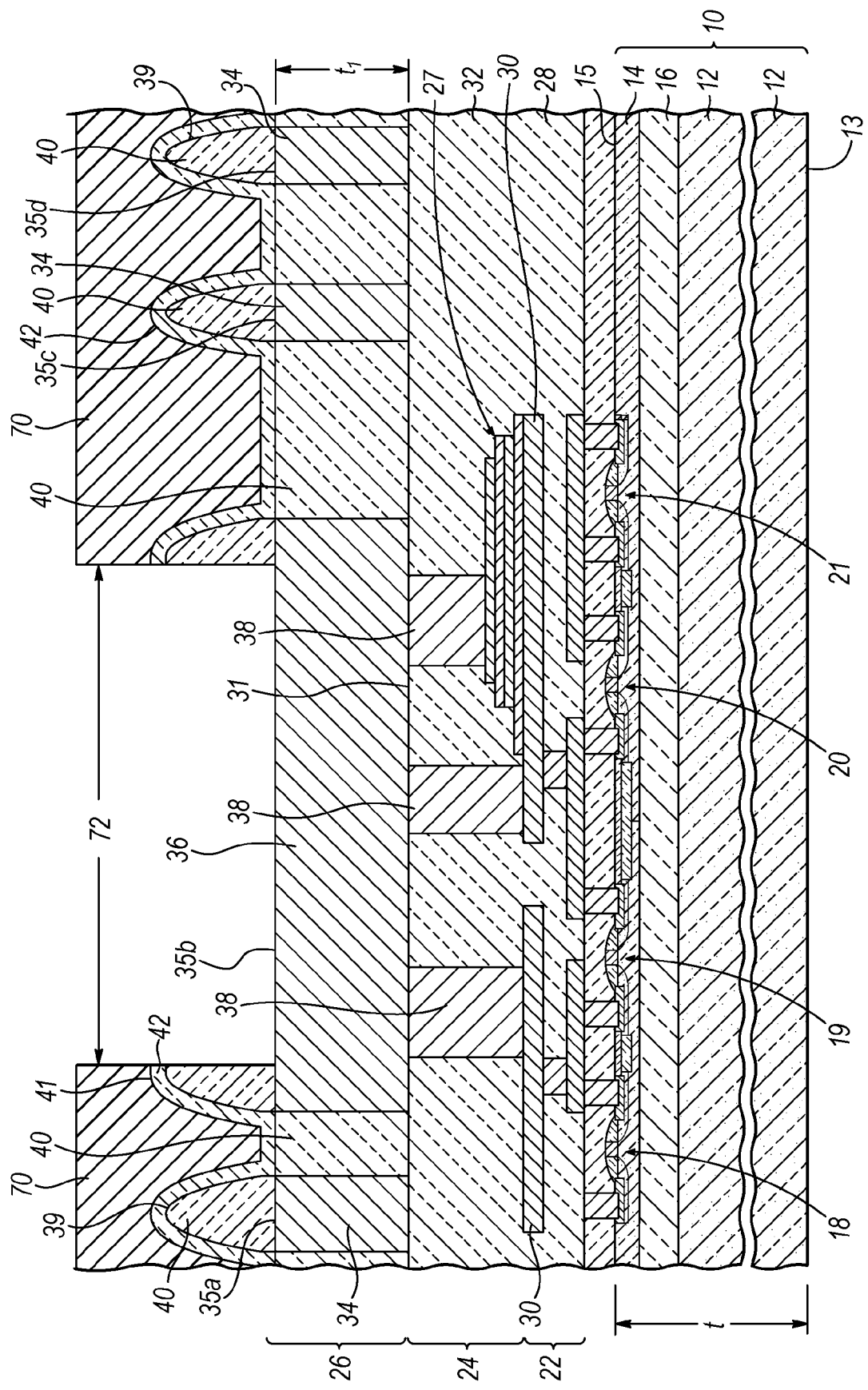
FIG. 9 is a cross-sectional view similar to FIG. 2 of a stage in a substrate bonding process in accordance with an alternative embodiment of the invention.

With reference to FIG. 9 in which like reference numerals refer to like features in FIG. 2 and in accordance with an alternative embodiment, a reverse mask layer 70 may be formed on the top surface 41 of insulator layer 42 and patterned with a conventional photolithography process. The reverse mask layer 70 may be comprised of a radiation-sensitive resist applied by a spin coating process and then heated in a soft baking process to drive off excess solvent and to promote partial solidification. In the photolithography process, the resist is exposed to radiation imaged using a photomask, baked after exposure, and developed to define residual areas of resist material that operate as the reverse mask layer 70.

After patterning, the reverse mask layer 70 includes an aperture or opening 72 that extends to the depth of the insulator layer 42. The opening 72 operate as a window that substantially coincides with the location of a portion of insulator layers 40, 42 that covers the bond pad 36. The opening 72 may be slightly smaller dimensionally than the surface area of the bond pad 36 to ensure that the subsequent etching process will stop on the bond pad 36. The reverse mask layer 70 covers and protects the remainder of the insulator layers 40, 42.

An etch process, such as a RIE process, is used to at least partially remove dielectric material of the insulator layers 40, 42 over the surface area exposed through opening 72 in the reverse mask layer 70. In the representative embodiment, the entire thickness of insulator layers 40, 42 has been removed. Alternatively, the removed thickness may be less than the entire thickness of insulator layers 40, 42 so that a thinned region of dielectric material overlies the bond pad 36. After the reverse mask layer 70 is removed, a cleaning process may be used to remove residual mask material.

The use of the reverse mask layer 70 may improve the surface uniformity of the CMP process by locally reducing the height of relatively tall features. For example, the feature height of the bond pad 36 and insulator layers 40, 42 may be at least twice the height, h, of the bond pad 36. As a numerical example, bond pad 36 may have a 4 μm height, insulator layer 40 may have a 4 μm height, and insulator layer 42 may have a 1 μm height, which provides a feature height of 9 μm. After etching using the reverse mask layer 70, the volume of dielectric material that must be removed over the bond pad 36 is reduced, which reduces the requirements of the CMP process used to achieve the structure of FIG. 3.

Processing continues at the fabrication stage of FIG. 3, as described above, to produce the bonded structure shown in FIGS. 7 and 8.

Figure 10:
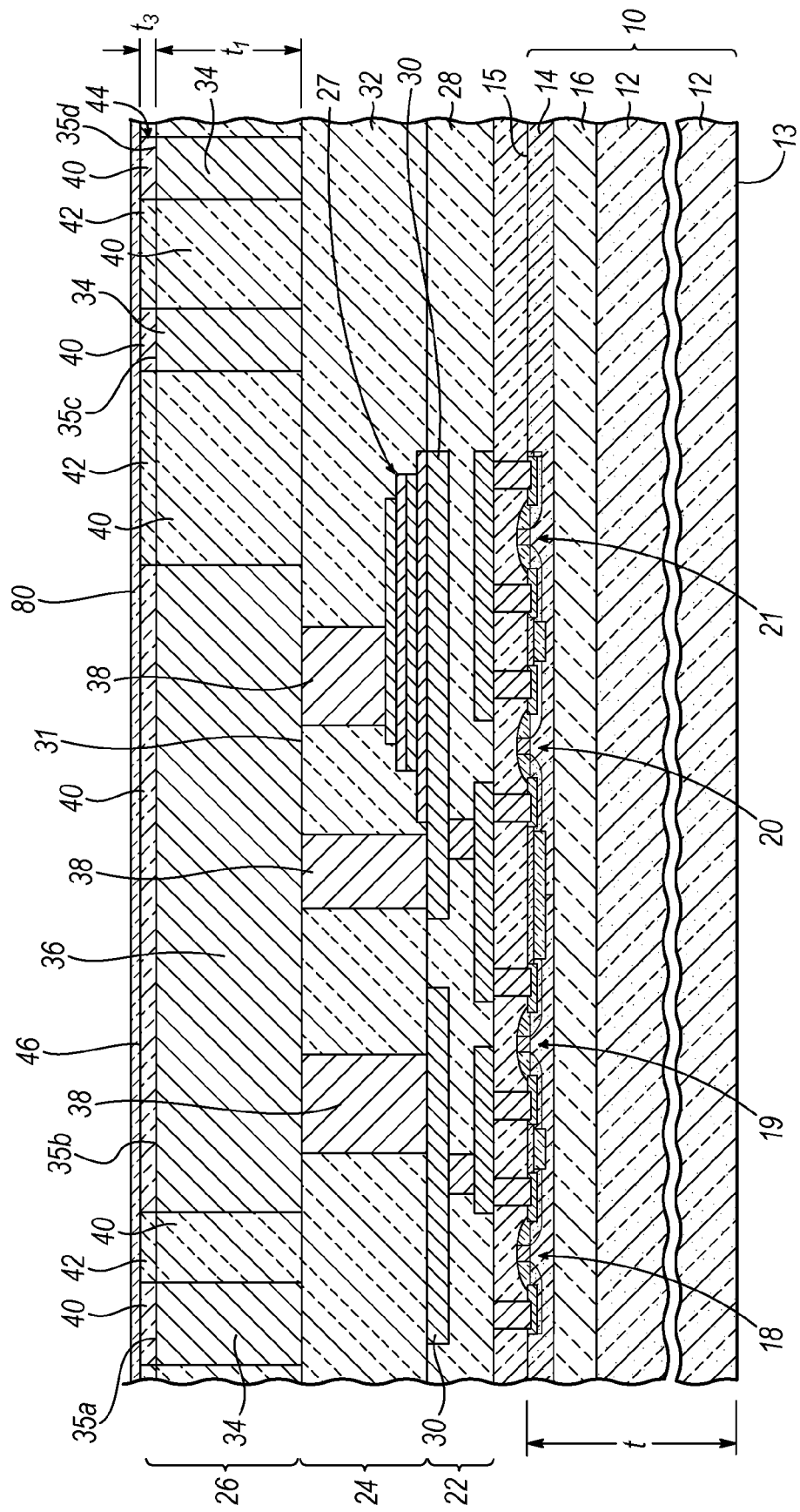
FIG. 10 is a cross-sectional view similar to FIG. 3 of a stage in a substrate bonding process in accordance with an alternative embodiment of the invention.

With reference to FIG. 10 in which like reference numerals refer to like features in FIG. 3 and in accordance with an alternative embodiment, a layer 80 may be formed on the flattened top surface 46 of composite insulator layer 44 and, in the representative embodiment, in a directly contacting relationship with the top surface 46. The layer 80 should be conformal so that the planarity of the top surface 46 is maintained after layer 80 is applied.

Layer 80 may be comprised of a dielectric material with a different etching selectivity than dielectric material of the underlying insulator layer 44, and that is compositionally different from at least one of the dielectric materials of insulator layers 40, 42 that are combined to form insulator layer 44. In one embodiment, layer 80 may be comprised of silicon nitride ($Si_3N_4$) deposited using CVD or another suitable deposition process and insulator layers 40, 42 may be comprised of silicon dioxide. When the bond pad 36 is opened (FIG. 4), the etching process may be conducted in a multiple etching steps with different etch chemistries selective to the different materials of insulator layers 44, 80.

Processing continues at the fabrication stage of FIG. 4, as described above, to produce the bonded structure similar to that shown in FIGS. 7 and 8 with the addition of layer 80 in the final construction.

Figure 11:
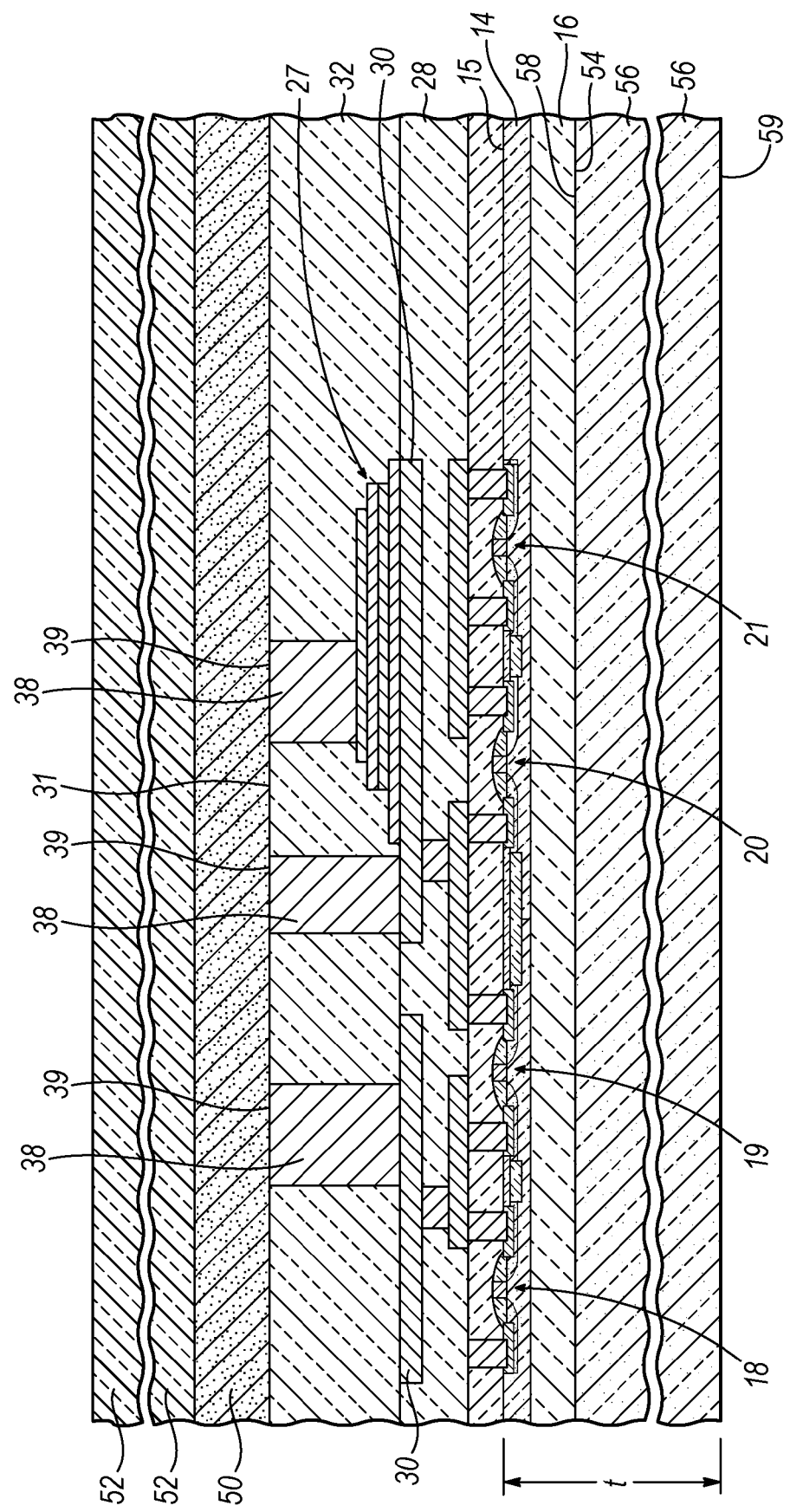
FIG. 11 is a cross-sectional view similar to FIG. 5 of an initial stage in a substrate bonding process in accordance with an alternative embodiment of the invention

With reference to FIG. 11 in which like reference numerals refer to like features in FIGS. 1 and 5 and in accordance with an alternative embodiment, the BEOL processing may be interrupted after the interlayer dielectric layer 32 and conductor-filled vias 38 of wiring layer 24 are formed. The top surface 31 of the interlayer dielectric layer 32 and a top surface 39 of the conductor-filled vias 38 are planarized with a CMP process similar to the planarization process described above (FIG. 4) to form the top surface 46 of insulator layer 44. In interconnect structures with multiple wiring layers, the BEOL process may be interrupted after the fabrication of any arbitrary wiring layer to perform the wafer bonding process.

The temporary handle substrate 52 is adhesively bonded by the adhesive layer 50 to the top surface 31 of the interlayer dielectric layer 32 as described above in the context of FIG. 5 and processing continues as described in FIGS. 6 and 7. After the surface 54 of the buried insulator layer 16 is bonded with the surface 58 of the final handle substrate 56 and the temporary handle substrate 52 and adhesive layer 50 are removed, wiring layer 24 may be formed as described above in the context of FIG. 1.

An improvement in bonding integrity is obtained by the planarization of the top surface 31 of the interlayer dielectric layer 32 that is opposite to the surface 54 of the buried insulator layer 16 of device substrate 10 implicated in the bonding process with the surface 58 of the final handle substrate 56. The planarized top surface 31 is distinguishable from the surface 54 of the buried insulator layer 16 of device substrate 10 involved in the bonding process with the surface 58 of the final handle substrate 56, and is an opposite surface to surface 54. The planarized top surface 31 is coupled in a removable manner with the temporary handle substrate 52 in advance of the transfer to the final handle substrate 56.

Figure 12:
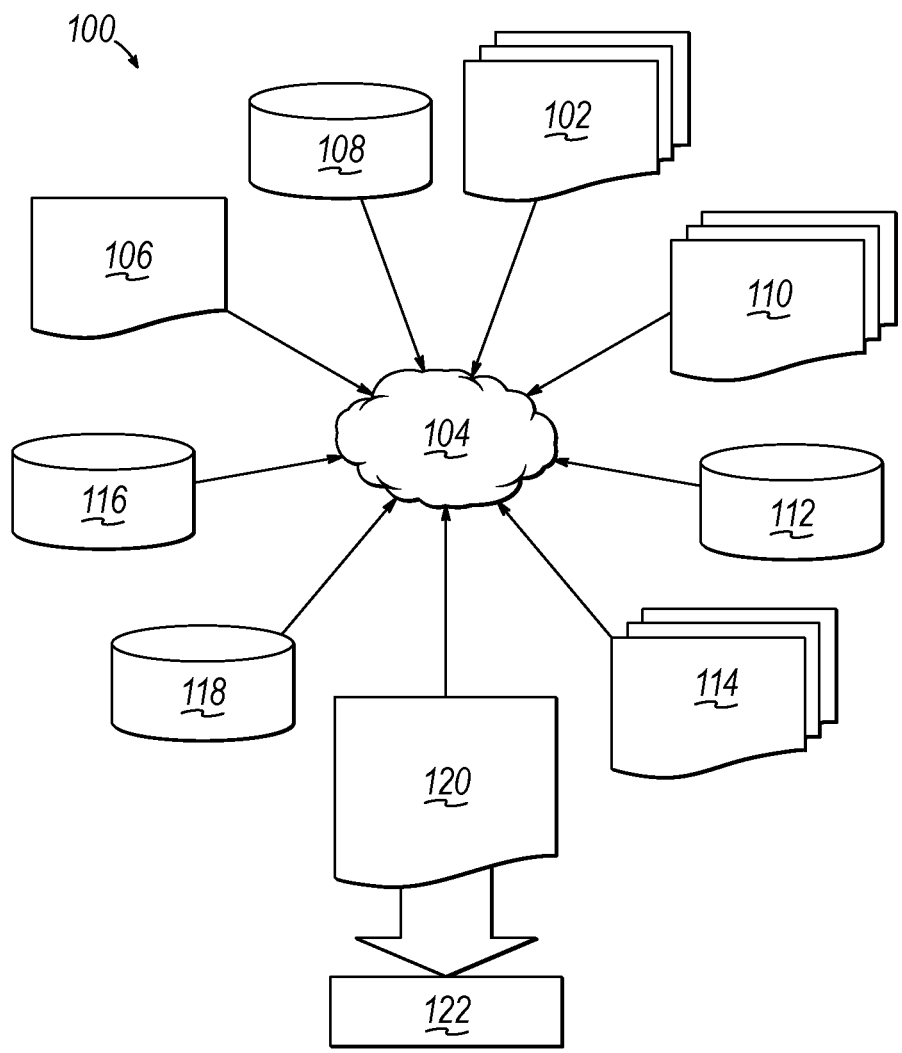
FIG. 12 is a flow diagram of a design process used in semiconductor design, manufacture, and/or test.

FIG. 12 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 5-7 and 9-11. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 5-7 and 9-11. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 5-7 and 9-11 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 84 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 5-7 and 9-11. In one embodiment, design structure 120 may comprise a compiled, executable HDL simulation model that functionally simulates the devices shown in FIGS. 5-7 and 9-11.

Design structure 120 may also employ a data format used for the exchange of layout data of integrated circuits and/or symbolic data format (e.g., information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 5-7 and 9-11. Design structure 120 may then proceed to a stage 122 where, for example, design structure 120: proceeds to tape-out, is released to manufacturing, is released to a mask house, is sent to another design house, is sent back to the customer, etc.

The method, as described above, is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. The term "lateral" refers to a dimension within the horizontal plane.

It will be understood that when an element is described as being "connected" or "coupled" to or with another element, it can be directly connected or coupled with the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

While the invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described.

What is claimed is:

1. A method of substrate bonding involving a device substrate having a first surface and a second surface opposite to the first surface, the method comprising:

forming device structures of at least one product chip using the first surface of the device substrate;

forming a first wiring layer of an interconnect structure for the device structures of the at least one product chip;

planarizing the first wiring layer;

in response to planarizing the first wiring layer, removably bonding a temporary handle wafer to the first wiring layer; and in response to removably bonding the temporary handle wafer to the first wiring layer, bonding the second surface of the device substrate to a final handle substrate, wherein the device structures are formed for first and second product chips using the first surface of the device substrate, the first product chip is separated from the second product chip by a kerf street, and the kerf street is planarized when the first wiring layer of the interconnect structure is planarized.

2. The method of claim 1 wherein the at least one insulator layer includes a first insulator layer comprised of a first dielectric material, the interconnect structure includes an interlayer dielectric layer with a top surface, the first wiring layer includes first and second conductive features that project above the top surface of the interlayer dielectric layer, and the first and second conductive features are separated by a gap, and planarizing the first wiring layer further comprises:

filling the gap between the first and second conductive features with the first insulator layer.

3. The method of claim 2 wherein the at least one insulator layer includes a second insulator layer comprised of a second dielectric material, and further comprising:

depositing the second insulator layer on the first insulator layer.

4. The method of claim 3 wherein the first and second insulator layers each include a first portion over the first conductive feature and a second portion over the gap, the first portions projecting by a first height above the top surface of the interlayer dielectric layer, and the second portions projecting by a second height above the top surface of the interlayer dielectric layer and further comprising:

polishing the first and second insulator layers to reduce a difference between the first height and the second height.

5. The method of claim 4 wherein, after polishing, the first dielectric material of the first insulator layer covers a top surface of the first conductive feature and a top surface of the second conductive feature, and the second dielectric material of the second insulator layer covers the first dielectric material of the first insulator layer filling the gap.

6. The method of claim 4 further comprising:

after the first and second insulator layers are polished, depositing a third insulator layer comprising a third dielectric material on a polished surface of the first and second insulator layers, wherein the third dielectric material is compositionally different from at least one of the first and second dielectric materials.

7. The method of claim 4 further comprising:

before the first and second insulator layers are polished, depositing a reverse mask layer on the second insulator layer;

forming an opening in the reverse mask layer that is aligned with the first portions of the first and second insulator layers over the first conductive feature; and at least partially removing the first portion of the second insulator layer exposed through the opening with an etch process.

8. The method of claim 7 wherein the first insulator layer exposed through the opening is completely removed, and further comprising:

at least partially removing the first portion of the first insulator layer exposed through the opening with the etch process.

9. The method of claim 2 wherein the first dielectric material filling the gap is free of voids, and filling the gap between the first and second conductive features with the first insulator layer comprised of the first dielectric material comprises:
depositing silicon dioxide as the first dielectric material by a high density plasma chemical vapor deposition (HD-PCVD) process.

10. The method of claim 1 wherein the first wiring layer is planarized when the first wiring layer is formed.

11. The method of claim 10 further comprising:
in response to bonding the second surface of the device substrate to the final handle substrate, forming a second wiring layer of the interconnect structure on the first wiring layer.

12. The method of claim 1 wherein the device substrate includes a bulk substrate, a device layer, and a buried insulator layer separating the device layer from the bulk substrate, and further comprising:
removing the bulk substrate from the device substrate to expose the buried insulator layer and thereby define the second surface on the buried insulator layer that is subsequently bonded to the final handle substrate.

13. The method of claim 12 further comprising:
in response to bonding the second surface of the device substrate to the final handle substrate, removing the temporary handle wafer from the first wiring layer.

14. A method of substrate bonding involving a device substrate having a first surface and a second surface opposite to the first surface, the method comprising:
forming device structures of at least one product chip using the first surface of the device substrate;
forming a first wiring layer of an interconnect structure for the device structures of the at least one product chip;
planarizing the first wiring layer;
in response to planarizing the first wiring layer, removably bonding a temporary handle wafer to the first wiring layer;
in response to removably bonding the temporary handle wafer to the first wiring layer, bonding the second surface of the device substrate to a final handle substrate; and
after the second surface of the device substrate is bonded to the final handle substrate, removing the temporary handle wafer from the first wiring layer.

15. The method of claim 1 wherein removably bonding the temporary handle wafer to the first wiring layer comprises:
applying an adhesive layer to a top surface of the first wiring layer; and
adhesively bonding the temporary handle wafer to the first wiring layer with the adhesive layer.

16. The method of claim 15 further comprising:
releasing the temporary handle wafer from the first wiring layer by delamination along an interface between the adhesive layer and the top surface of the first wiring layer.

17. A method of substrate bonding involving a device substrate having a first surface and a second surface opposite to the first surface, the method comprising:
forming device structures of at least one product chip using the first surface of the device substrate;
forming a first wiring layer of an interconnect structure for the device structures of the at least one product chip;
depositing at least one insulator layer on the first wiring layer;
after the at least one insulator layer is deposited on the first wiring layer, planarizing the first wiring layer;
in response to planarizing the first wiring layer, removably bonding a temporary handle wafer to the first wiring layer; and
in response to removably bonding the temporary handle wafer to the first wiring layer, bonding the second surface of the device substrate to a final handle substrate.

18. The method of claim 17 wherein removably bonding the temporary handle wafer to the first wiring layer comprises:
applying an adhesive layer to a top surface of the first wiring layer and a top surface of the at least one insulator layer; and
adhesively bonding the temporary handle wafer to the first wiring layer and the at least one insulator layer with the adhesive layer.

19. The method of claim 1 wherein bonding the second surface of the device substrate to the final handle substrate comprises:
partially removing the device substrate to define the second surface that is subsequently bonded to the final handle substrate.

20. The method of claim 19 wherein the device substrate is partially removed by grinding, etching, chemical mechanical polishing, or a combination thereof.

21. The method of claim 12 wherein the bulk substrate is removed from the device substrate by grinding, etching, chemical mechanical polishing, or a combination thereof.

22. The method of claim 13 further comprising:
after the bulk substrate is removed, thinning the buried insulator layer by partial removal.

* * * * *